United States Patent [19]

Esch et al.

[11] 4,219,834
[45] Aug. 26, 1980

[54] ONE-DEVICE MONOLITHIC RANDOM ACCESS MEMORY AND METHOD OF FABRICATING SAME

[75] Inventors: Ronald P. Esch, San Jose, Calif.; Robert M. Folsom, Reston; Cheng-Yih Liu, Woodbridge, both of Va.; Vincent L. Rideout, Mohegan Lake, N.Y.; Donald A. Soderman, Vienna; G. Thomas Wenning, Manassas, both of Va.

[73] Assignee: International Business Machines Corporation, Armonk, N.Y.

[21] Appl. No.: 850,762

[22] Filed: Nov. 11, 1977

[51] Int. Cl.$^2$ ............................................. H01L 27/02
[52] U.S. Cl. ........................................ 357/41; 357/46; 357/45; 357/51; 357/53; 357/54; 357/55; 357/59
[58] Field of Search ...................... 357/41, 45, 46, 51, 357/53, 54, 55, 59

[56] References Cited

U.S. PATENT DOCUMENTS 3,811,076  5/1974  Smith ..................................... 357/41

Primary Examiner—Edward J. Wojciechowicz
Attorney, Agent, or Firm—Wesley DeBruin

[57] ABSTRACT

A dynamic random access memory is fabricated on a monolithic chip of semiconductor material. The memory is formed of an array of memory cells controlled for reading and writing by word and bit lines which are selectively connected to the cells. Each cell is a single field effect transistor structure having improved electrical charge storage capability. The improved charge storage capability of each cell is provided by an electrical capacitance structure uniquely arranged and formed as an integral portion of the field effect transistor structure. The gate electrode of each field effect transistor structure is connected to a predetermined one of said word lines. The drain of each field effect transistor is connected to a predetermined one of said bit lines. The source of each field effect transistor structure is integrally connected to and forms a portion of the uniquely arranged electrical capacitance structure of the field effect transistor structure. The electrical capacitance or storage node structure of each cell has increased electrical charge storage capacity and may be considered as a single capacitor. The single (storage) capacitor of each cell is provided between the source of the field effect transistor, a source of reference potential (reference plane) and the monolithic semiconductor substrate on which the memory is fabricated.

The arrangement of the memory cells, the structure and material of each of the memory cells, and a method of fabricating the entire memory is disclosed. Also disclosed is an improved field effect transistor structure and process for fabricating same. The process of fabrication, cell arrangement and the improved storage node of each memory cell, as structurally fabricated and uniquely arranged, provides a monolithic memory having improved density and operating characteristics.

3 Claims, 28 Drawing Figures

ONE-DEVICE MONOLITHIC RANDOM ACCESS MEMORY AND METHOD OF FABRICATING SAME

The above abstract is not to be taken either as a complete exposition or as a limitation of the present invention, the full nature and extent of the invention being discernible only by reference to and from the entire disclosure.

BACKGROUND OF THE INVENTION

1. Field of the Invention

The invention relates to integrated circuits and more particularly to integrated circuits which employ field effect transistors. More specifically, the invention relates to improved field effect transistor structures and to a process for fabricating same. Still more specifically, the invention relates to an improved monolithic memory and process for fabricating same.

2. Description of the Prior Art

Metal Oxide Semiconductor Field Effect transistors (MOSFETS) or Insulated Gate Field Effect Transistors (IGFETS) are well known in the art. Reference is made to article "Metal-Oxide-Semiconductor Technology" by William C. Hittinger, published in the August 1973 issue of Scientific American, pages 48 through 57. There are numerous patents, published articles and texts which disclose the theory, methods of fabricating and circuit devices utilizing MOSFETS or IGFETS. One such text is "MOSFET in Circuit Design" by Robert H. Crawford (Texas Instruments Electronic Series) McGraw Hill, copyrighted 1967 by Texas Instruments Incorporated. Another text is "Electronics: BJTs, FETs, and Microcircuits" by E. James Angelo, Jr., McGraw-Hill Electrical and Electronic Engineering Series, copyrighted by McGraw-Hill 1969.

The MOSFET or IGFET transistor generally comprises a first semiconductor region in which source and drain regions of opposite conductivity type to the region are disposed. A channel region is defined between the source and drain regions. The channel conductivity is variable in accordance with potentials applied to a gate electrode capacitively coupled thereto through an insulating layer disposed on the channel surface. Field effect type transistors are of increasing interest and commercial importance, particularly because of their high input impedance compared with bipolar transistors and also because a large number of such elements may be economically disposed in a single body of material.

Semiconductor memory arrays have and are receiving considerable attention in the art. Semiconductor memories have numerous advantages over prior art storage devices, such as magnetic cores, in that they require less power to operate and additionally, a greater amount of information may be stored for a given structural volume of physical memory. Among the prior art semiconductor arrays are included those where information is stored on a capacitor, typically parasitic capacitance, and wherein the information must be refreshed periodically. Also among the prior art semiconductor arrays are the type employing a MOS device having a floating gate as a memory element and the type employing a floating avalanche-injection MOS device. Other prior art semiconductor memory devices use flip-flops or circuits equivalent thereto for storing information.

U.S. Pat. No. 3,387,286 granted June 4, 1968 to Robert H. Dennard is directed to a "Field-Effect Transistor Memory". The memory is formed of an array of memory cells controlled for reading and writing by word and bit lines which are connected to the cells. Each cell is formed, in one embodiment, using a single field-effect transistor and a single capacitor. The gate electrode of the transistor is connected to the word line, the source terminal to the bit line, and the drain terminal directly to one of the electrodes of the capacitor. The other electrode of the capacitor is connected to a reference potential. Information is stored by charging the capacitor through the transistor and information is read out by discharging the capacitor through the transistor. During a write operation the word line, which is connected to the gate of the transistor, is energized to render the transistor conductive between source and drain. If a "zero" is to be stored, the bit line is not energized and the capacitor is not charged. If a "one" is to be stored, the bit line is energized and the capacitor is charged to essentially the potential of the bit line signal. During read operations only the word line is energized and a signal is transmitted to the bit line if a one has been stored previously and the capacitor is charged. Since the charge on the capacitor does leak off, it is necessary to periodically regenerate the information stored in the memory.

In another disclosed embodiment in U.S. Pat. No. 3,387,286, rather than storing a charge in a conventional capacitor, a second field effect transistor is used and the charge is stored in the capacitance between the gate and substrate of this transistor. In this memory, the readout is nondestructive with the charge stored at the gate of the second transistor being used to render that transistor conductive when a binary one is stored, so that the word line signal is transmitted through this second transistor to the bit sense line.

Reference is made to the publication "Integrated High-Speed Read-Only Memory with Slow Electronic Write" by A. S. Faber, IBM Technical Disclosure Bulletin, Vol. 8, No. 3, August 1965, pages 461 and 462.

Reference is made to the publication "Nondestructive Readout Memory Cell Using MOS Transistor" by P. Pleshko, IBM Technical Disclosure Bulletin, Vol. 9, No. 8, January 1966, pages 1142 and 1143.

Reference is made to the publication "Integrated MOS Transistor Random Access Memory" by J. D. Schmidt, Solid State Design, January 1965, pages 21-25.

Reference is made to U.S. Pat. No. 3,461,312 granted Aug. 12, 1969 entitled "Signal Storage Circuit Utilizing Charge Storage Characteristics of Field Effect Transistor", Ser. No. 403,482 filed Oct. 13, 1964 by Arnold Faber et al., and of common assignee herewith.

Reference is made to U.S. Pat. No. 3,593,037 granted July 13, 1971 to Marcial E. Hoff, Jr., directed to "Cell for MOS Random Access Integrated Circuit Memory". The cell is a dynamic storage device which utilizes the parasitic capacitance associated with the lead and gate of an MOS device for storage. The cell is adaptable for use in a memory which has a separate select-write line, select-read line, write data line and read data line.

Reference is made to U.S. Pat. No. 3,720,922 granted Mar. 13, 1973 to Walter F. Kosonocky and entitled "Charge Coupled Memory". The charge coupled memory semiconductor substrate has a plurality of polysilicon storage electrodes, each extending in the column direction and each coupled to the substrate at spaced regions along its length. A plurality of digit lines extending also in the column direction, each digit line capable of acting as a source of minority charge carrier for a column of storage locations. A plurality of word lines extending in the row direction each such line being coupled to a row of storage electrodes. Each such line controlling the flow of minority charge carriers between the respective digit lines and their storage locations along that word line.

Reference is made to U.S. Pat. No. 3,740,732 granted June 19, 1973 to Pierre M. Frandon and directed to a "Dynamic Data Storage Cell". The dynamic data storage cell disclosed in U.S. Pat. No. 3,740,732 requires only one insulated field effect transistor to store binary data. The drain of the FET is connected to a data input line and data is stored at the source node of the transistor by inherent capacitance between the source diffusion and the substrate. The capacitance of the source electrode is enhanced by forming a heavily doped layer to underlie a portion of the source diffusion. Using the substrate as circuit ground enables the fabrication of an array of transistors for a random access memory.

Reference is made to U.S. Pat. No. 3,699,646, entitled "Integrated Circuit Structure and Method for Making Integrated Circuit Structure", granted Oct. 24, 1972 to Leslie L. Vadasz. A method for simultaneously completing the formation of a contact, an interconnect, a gate and a source or drain is disclosed. An integrated circuit field effect structure wherein a diffused silicon area is connected directly to a polysilicon member by conductive silicon and more specifically, the source or drain of one device is directly and continuously connected to the gate of an adjacent device by a conductive silicon member.

Reference is made to U.S. Pat. No. 3,774,176 granted Nov. 20, 1973 to Karl-Ulrich Stein et al. and entitled "Semiconductor Memory Having Single Transistor Storage Elements and a Flip Flop Circuit for the Evaluation and Regeneration of Information". More specifically, U.S. Pat. No. 3,774,176 discloses a dynamic semiconductor memory having a plurality of single transistor storage elements connected to a digit line and respective selection lines, an evaluation and regeneration circuit including a flip-flop having a pair of input/output points, each of the points connected to one of the digit lines, and means connecting the points including a controllable semiconductor switch operable to place the points at equal potentials prior to reading from a selected storage element.

Reference is made to U.S. Pat. No. 3,811,076 granted May 14, 1974 to William M. Smith, Jr. and entitled "Field Effect Transistor Integrated Circuit and Memory." An integrated circuit structure of a field effect transistor serially connected to a capacitor has the capacitor formed by one of the current flow electrodes of the FET and by a polycrystalline silicon (polysilicon) field shield. The structure includes, in a semiconductor (e.g. silicon) substrate, of e.g., P-type conductivity, two spaced apart regions of opposite conductivity type to that of the substrate, e.g., N-type. One of the spaced regions serves as a first plate of the capacitor and as a first current flow electrode of the FET. The other region serves as a second current flow electrode of the FET. A first insulating layer (composite of silicon nitride and silicon dioxide) on the substrate has a polysilicon layer on it covering the two spaced regions and is directly and ohmically electrically connected to the substrate. The portion of the polysilicon layer over the spaced region serving as the first plate of the capacitor serves as the second plate of the capacitor. A second insulating layer covers the polysilicon layer and a second layer of conducting material, e.g., aluminum, is provided on the second insulating layer. The second conductive layer overlies the space between the two spaced regions and serves as a gate electrode for the FET. When employed as a memory circuit, the spaced region of the opposite conductivity type to the substrate which does not serve as the first plate of the capacitor is desirably a diffused bit/sense line and the second conducting layer serves as a word line.

Reference is made to U.S. Pat. No. 3,792,319 granted Feb. 12, 1974 to Frederick Tsang and entitled "Poly-Crystalline Silicon Fusible Links for Programmable Read Only Memories". Disclosed is a programmable read-only memory using doped polycrystalline silicon fusible links deposited on the top surface of an insulating (e.g. silicon oxide) layer over an integrated circuit and connected through windows in the insulating layer and/or by a metallization layer. The term "fusible" as here employed refers to electrical energization of the link resulting in said link being rendered electrically discontinuous.

Reference is made to U.S. Pat. No. 3,825,946 granted July 23, 1974 to Dov Frohman—Bentchkowsky and entitled "Electrically Alterable Floating Gate Device and Method for Altering Same". A field effect device having a floating gate which can be charged or discharged electrically is disclosed. A pair of spaced apart regions in a substrate define a channel above which a floating gate is disposed and insulated from the channel. The regions have a conductivity type opposite of the substrate. A second gate is disposed above and insulated from the floating gate. The floating gate may be charged electrically by producing an avalanche breakdown at the junction formed by one of the spaced apart regions and the substrate causing the passage of electrons through the insulation into the floating gate. The floating gate may be discharged by the application of a voltage to the second gate relative to the spaced apart regions and substrate causing the passage of electrons from the floating gate through the insulation onto the second gate.

Reference is made to U.S. Pat. No. 3,943,542 granted Mar. 9, 1976 to Irving T. Ho and Jacob Riseman and entitled "High Reliability, Low Leakage Self-Aligned Silicon Gate FET and Method of Fabricating Same." The gate structure of the FET includes a phosphosilicate glass as the insulator and polysilicon as the gate conductor. A thin layer of silicon nitride is formed over the polysilicon and selectively etched so as to remain only over gate areas and other areas where it is desired to extend the polysilicon as a conductor. The unmasked polysilicon is oxidized to form the thick oxide surface coating. The disclosure also describes the use of oxide rings and epitaxial layers to reduce parasitic effects between adjacent FET devices in an integrated circuit.

Reference is made to U.S. Pat. No. 3,983,543 granted Sept. 28, 1976 to William Cordaro and entitled "Random Access Memory Read/Write Buffer Circuits Incorporating Complementary Field Effect Transistors". In U.S. Pat. No. 3,983,543, a Read/Write Circuit for a random access memory integrated circuit chip based on complementary enhancement mode field effect transistor technology is disclosed.

Reference is made to U.S. Pat. No. 3,974,486 granted Aug. 10, 1976 to Huntington W. Curtis and Roger L.

Verkuil entitled "Multiplication Mode Bistable Field Effect Transistor and Memory Utilizing Same." Disclosed is a single device memory cell comprising essentially an FET structure. The FET structure has a negative resistance characteristics largely obtained by exploiting an electron hole pair multiplication effect which is enhanced by high substrate doping in conjunction with appropriate biasing of the junctions within the device.

Reference is made to U.S. Pat. No. 3,983,545 granted Sept. 28, 1976 to William Cordaro entitled "Random Access Memory Employing Single Ended Sense Latch for One Device Cell". Disclosed is a random access memory having a plurality of groups of storage cells, each storage cell of each group being adapted to store an electrical manifestation of a binary 1, or an electrical manifestation of a binary 0, a sense latch for each of said groups of storage cells for controllably sensing the binary value 0 or 1 stored in any one of said storage cells included within the group of storage cells with which said sense latch is associated, each of said sense latches comprising: a first field effect transistor directly connected to each cell of a group of storage cells, second, third, fourth and fifth field effect transistors respectively connected to said first field effect transistor and to each of the other ones of said second, third, fourth and fifth field effect transistors, means for controlling the conductivity of said first, second, third, fourth and fifth transistors on a selective basis, whereby a binary 1 or a binary 0 may be read from and restored to any predetermined cell in each group.

Reference is made to U.S. patent application, Ser. No. 617,462, filed Sept. 29, 1975, entitled "Self-Aligned Integrated Circuits" by Anatol Furman, Howard L. Kalter and Johann W. Nagel, issued as U.S. Pat. No. 4,021,789, on May 3, 1977 and of common assignee herewith. The Furman et al application discloses semiconductor integrated circuits, including e.g., field effect transistors and memory cells employing field effect transistors, which are formed by providing at a surface of a semiconductor substrate a pair of isolation mediums and a plurality of spaced apart conductive lines extending between the isolation mediums. The conductive lines, such as polycrystalline silicon or polysilicon lines, are preferably thermally, chemically or anodically self-insulatable in an unmasked batch process step and are made of a material suitable for defining a barrier to a dopant for the semiconductor substrate. Signal or bias voltages are applied to selected or predetermined conductive lines to provide control electrodes or field shields for the transistors. When the substrate has deposited on its surface an insulating medium made of a dual dielectric, such as silicon dioxide—silicon nitride, the dopant may be ion implanted through the insulating medium to form, e.g., the source and drain electrode of the transistors as defined by the isolation mediums and the conductive lines. Other elements may be added to the structure to form, e.g., a memory cell. By depositing a conductive medium over the insulated conductive lines, the medium may be appropriately etched to provide desired access lines, capacitor electrodes, ground planes or additional field shields for the cells.

Reference is made to U.S. patent application Ser. No. 671,907, filed Mar. 29, 1976, entitled "Field Effect Transistor Lost Film Fabrication Process" by Arup Bhattacharyya and Ronald Silverman issued as U.S. Pat. No. 4,094,057 on June 13, 1978 and of common assignee herewith. The Bhattacharyya et al patent discloses a process for fabricating transistor memory cell arrays which includes forming a thin oxide which is continuous over the entire area and which is continuously protected from the time it is deposited so that subsequent processing steps will not cause any change in the thickness of the thin oxide except where deliberately desired. The process uses a selected combination of material deposition steps coupled with photoresist masking, anodizing and etching steps. By first depositing a protective masking film and subsequently removing this film in a series of steps, so that this film is lost in the fabrication process, the need for using the dual dielectric insulating layers is eliminated. By eliminating such dual dielectric insulating layers the performance and density of the arrays can be improved. Semiconductor arrays, including, e.g., field effect transistors and memory cells employing field effect transistors, are formed by providing at a surface of a semiconductor substrate a pair of isolation lines and a plurality of spaced apart conductive lines orthogonal to the isolation lines. The conductive lines are preferably anodically self insulatable. Signal or bias voltages are applied to selected or predetermined conductive lines to provide control electrodes or field shields for the transistors. When the substrate has deposited on its surface an insulating medium, such as silicon dioxide, the dopant may be ion implanted through the insulating medium to form, e.g., the source and drain electrode of the transistors. Other elements may be added to the structure to form, e.g., a memory cell.

The art extensively teaches memory cells comprised of storage Flip-Flop circuits or bistable devices utilizing first and second cross coupled field effect transistors. For example, memory cells of the type employing cross coupled field effect transistors having two stable states of conductivity are disclosed in the following publications: "Integrated High-Speed, Read-Only Memory with Slow Electronic Write" by A. S. Faber, IBM Technical Disclosure Bulletin, Vol. 8, No. 3, August 1965, pages 461 and 462; and "Nondestructive Readout Memory Cell Using MOS Transistors", Vol. 8, No. 8, January 1966, pages 1142 and 1143.

Reference is made to U.S. Pat. No. 3,461,312 entitled "Signal Storage Circuit Utilizing Charge Storage Characteristics of Field Effect Transistors" granted Aug. 12, 1969 to A. S. Farber and C. E. Ruoff and of common assignee herewith. The Farber et al patent discloses a shift register and memory cell utilizing the gate to source capacitance of a field effect transistor for the storage of electrical charge.

As further evidenced by the following patents and publication one device memory cells and monolithic memory arrays employing same are well known to the art:

U.S. Pat. No. 3,514,765 granted May 26, 1976 to A. O. Christensen entitled "Sense Amplifier Comprising Cross Coupled MOSFET's Operating In a Race Mode for Single Device per Bit MOSFET Memories";

U.S. Pat. No. 3,740,732 granted June 19, 1973 to Pierre M. Frandon entitled "Dynamic Data Storage Cell";

U.S. Pat. No. 3,745,539 granted July 10, 1973 to E. E. Davidson, R. D. Lane and J. Saia entitled "Latch Type Regenerative Circuit for Reading A Dynamic Memory Cell";

U.S. Pat. No. 3,774,176 granted Nov. 20, 1973 entitled "Semiconductor Memory Having Single Transistor Storage Elements and a Flip-Flop Circuit for the Evaluation and Regeneration of Information";

U.S. Pat. No. 3,789,371 granted Jan. 19, 1974 to Seymour Markowitz entitled "MOSFET Memory Cell";

U.S. Pat. No. 3,851,317 granted Nov. 26, 1974 to R. A. Kenyon entitled "Double Density Non-Volatile Memory Array";

U.S. Pat. No. 3,983,544 granted Sept. 28, 1976 to R. T. Dennison, L. B. Freeman, H. J. Kelly, P. T. S. Liu entitled "Split Memory Array Sharing Same Sensing and Bit Decode Circuitry";

U.S. Pat. No. 3,992,701 granted Nov. 16, 1976 to S. A. Abbas and R. C. Dockerty entitled "Non-Volatile Memory Cell and Array Using Substrate Current";

U.S. Pat. No. 3,992,704 granted Nov. 16, 1976 to Dieter Kantz entitled "Arrangement for Writing-In Binary Signals into Selected Storage Elements of A MOS-STORE"; and the published article entitled "Single-Transistor Cell Makes Room for More Memory On A MOS Chip" by Leo Cohen, Robert Green, Kent Smith and J. Leland Seely, Electronics, Aug. 2, 1971, pages 69-75.

SUMMARY OF THE INVENTION

It is a primary object of the invention to provide an improved solid state memory employing field effect transistors.

Is is an object of the invention to provide an improved solid state memory having single device memory cells.

It is an object of the invention to provide an improved solid state memory cell.

It is an object of the invention to provide an improved single device memory cell structure having enhanced electrical characteristics.

It is an object of the invention to provide a very high density solid-state array of memory cells wherein each memory cell includes a single field effect transistor structure having improved electrical charge storage capability.

It is an object of the invention to provide a very high density solid-state array of memory cells wherein each memory cell includes a single field effect transistor structure fabricated and arranged to provide increased density and improved performance of each cell and of the array of memory cells.

It is a further object of the invention to provide an improved field effect transistor structure.

It is a still further object of the invention to provide an improved one-device monolithic Random Access Memory and Method of fabricating same.

It is a still further object of the invention to provide an improved method for fabricating a high density integrated circuit device.

It is a still further object of the invention to provide a high density integrated circuit device including improved field effect transistor structures.

It is a still further object of the invention to provide an improved solid state device and an efficient improved method for manufacturing same.

In the present invention, a two dimensional Read/Write memory array is provided in an integrated circuit structure in which each memory cell in the array comprises a single field effect transistor structure. As will be more readily appreciated from the detailed description hereinafter information is stored in each field effect transistor structure by a storage capacitor whose capacitance is the sum of the capacitance provided by the source with respect to a conductive reference plane of the memory cell and the capacitance of the source with respect to the semiconductor substrate. The configuration and material (preferably polysilicon) of the reference plane of each memory cell with respect to the source of the field effect transistor thereof provides increased storage capacitance. The configuration, or layout, of each memory cell, as well as the arrangement of the memory cells within the array permits increased density. The employment of thin oxide as the gate dielectric, diffused bit lines, metal word lines, staggered cell arrangement of predetermined configuration, all of which will be more fully apparent from the detailed description hereinafter, further improves the density of the memory array without detracting from the improved performance of the array. The invention further includes an improved method of fabricating the array. The method requires a limited number of masking steps each of which are within the present state of art and provides improved gate alignment. As will be apparent to persons skilled in the art from the detailed disclosure and description of the invention set forth hereinafter, applicants' invention may be advantageously employed to provide structures and devices other than improved memory arrays and memory cells. For example, applicants' improved process or method for fabricating an improved memory array may be readily adapted by persons skilled in the art to provide integrated circuit devices such as programmed logic arrays (PLA's), microprocessors, logical circuits and the like preferably employing field effect transistors.

Further, the incorporation of a polysilicon conductor for one plate of the thin oxide storage capacitor of each memory cell allows overlapping metal word lines.

The foregoing and other objects, features and advantages of the invention will be apparent from the following more particular description of preferred embodiments of the invention, as illustrated in the accompanying drawings.

BRIEF DESCRIPTION OF THE DRAWINGS

FIG. 1 shows how FIGS. 1A and 1B are to be placed together to disclose a partly schematic diagram illustrating a monolithic memory in accordance with the invention.

FIG. 1C (composite of FIGS. 1AC, 1BC and 1DC) shows in greater detail the circuitry, in accordance with a preferred embodiment of the invention, of a portion of the monolithic memory of FIG. 1. FIGS. 1 and 1C are to be viewed in conjunction with the hereinafter set forth detailed explanation of the operation of the memory in accordance with the invention.

FIGS. 3A through 3M depict cross-sectional views of a first portion of a monolithic memory in accordance with the preferred embodiment of the invention after successive process steps in accordance with the process of this invention.

FIGS. 4A through 4F, viewed in conjunction with FIGS. 3A through 3M, depict selected cross-sectional views of a second portion of the monolithic memory in accordance with the invention and the successive process steps recited hereinafter with reference to FIGS. 3A through 3M.

Note: The process sequence indicated in FIGS. 3G and 3H can be reversed, whereby the polysilicon pattern is etched prior to the deposition of a P.S.G. glass layer and polysilicon N-type doping.

DESCRIPTION OF THE PREFERRED EMBODIMENTS OF THE INVENTION

Figures 1, 1A:
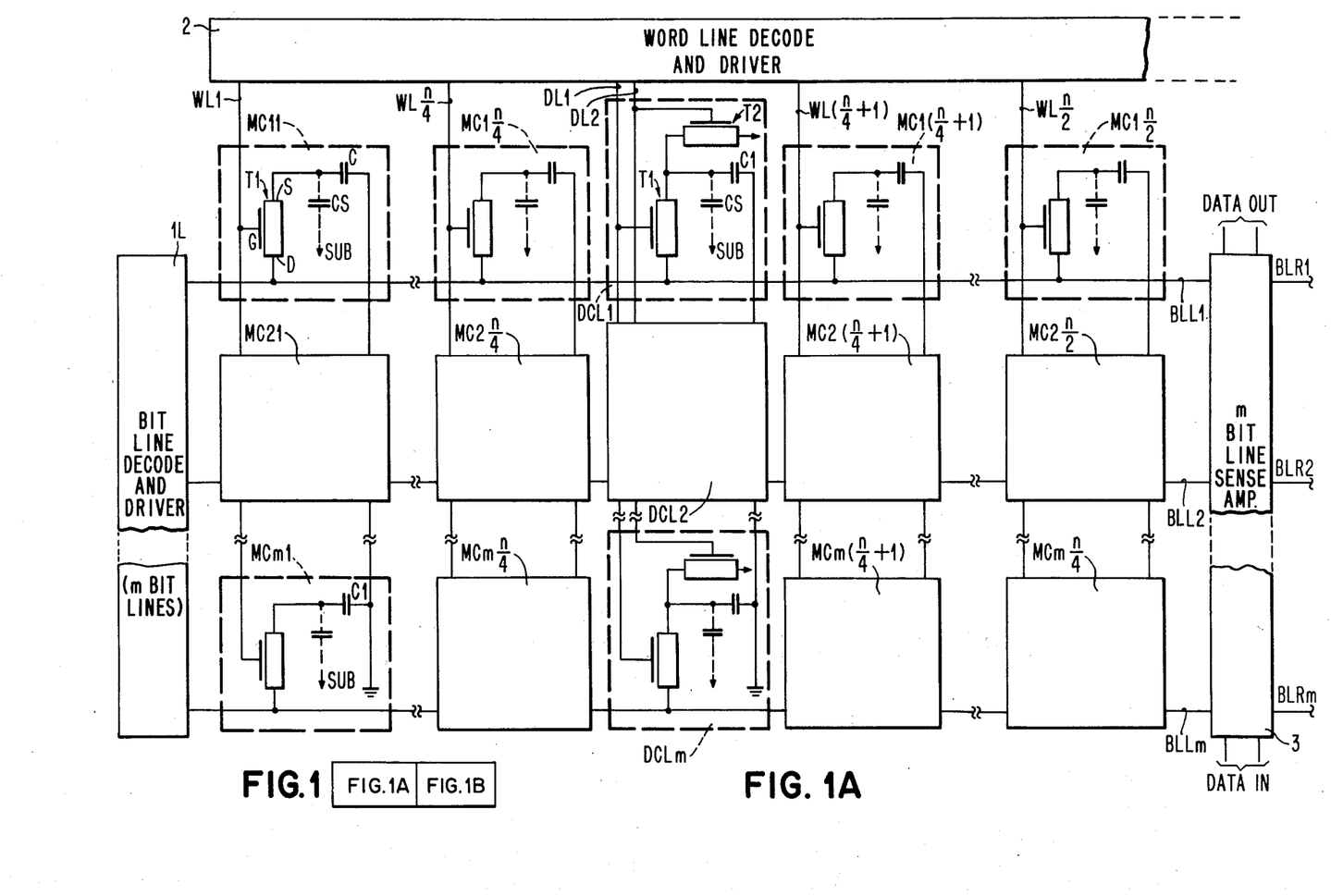
Figure 1:
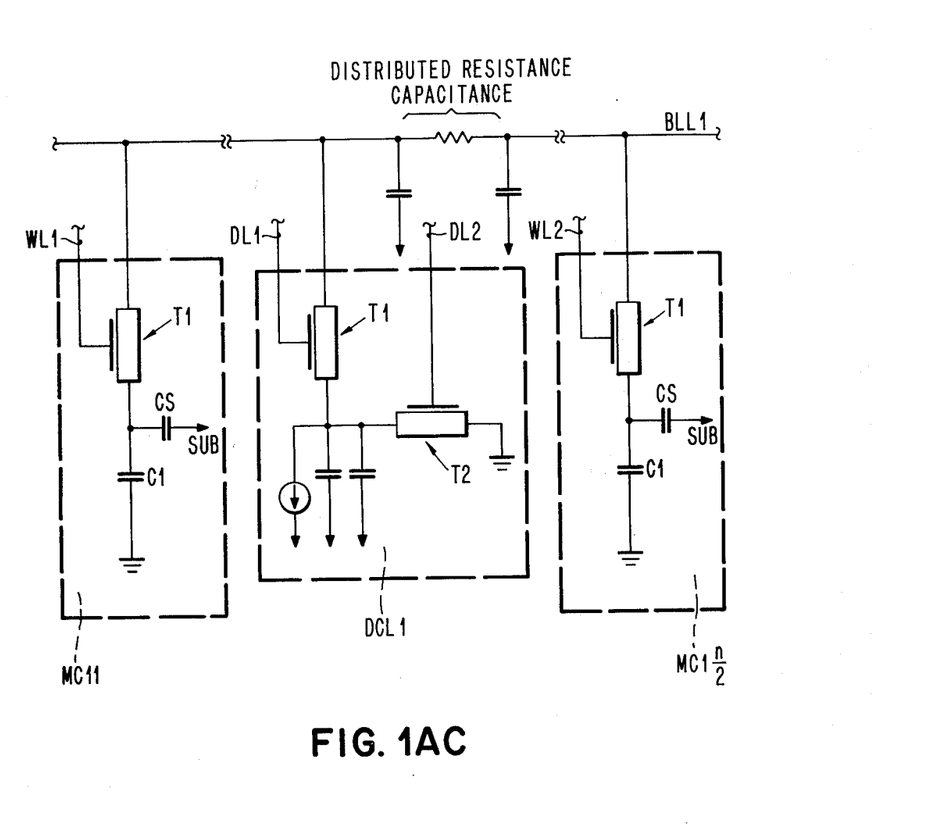
Figure 1B:
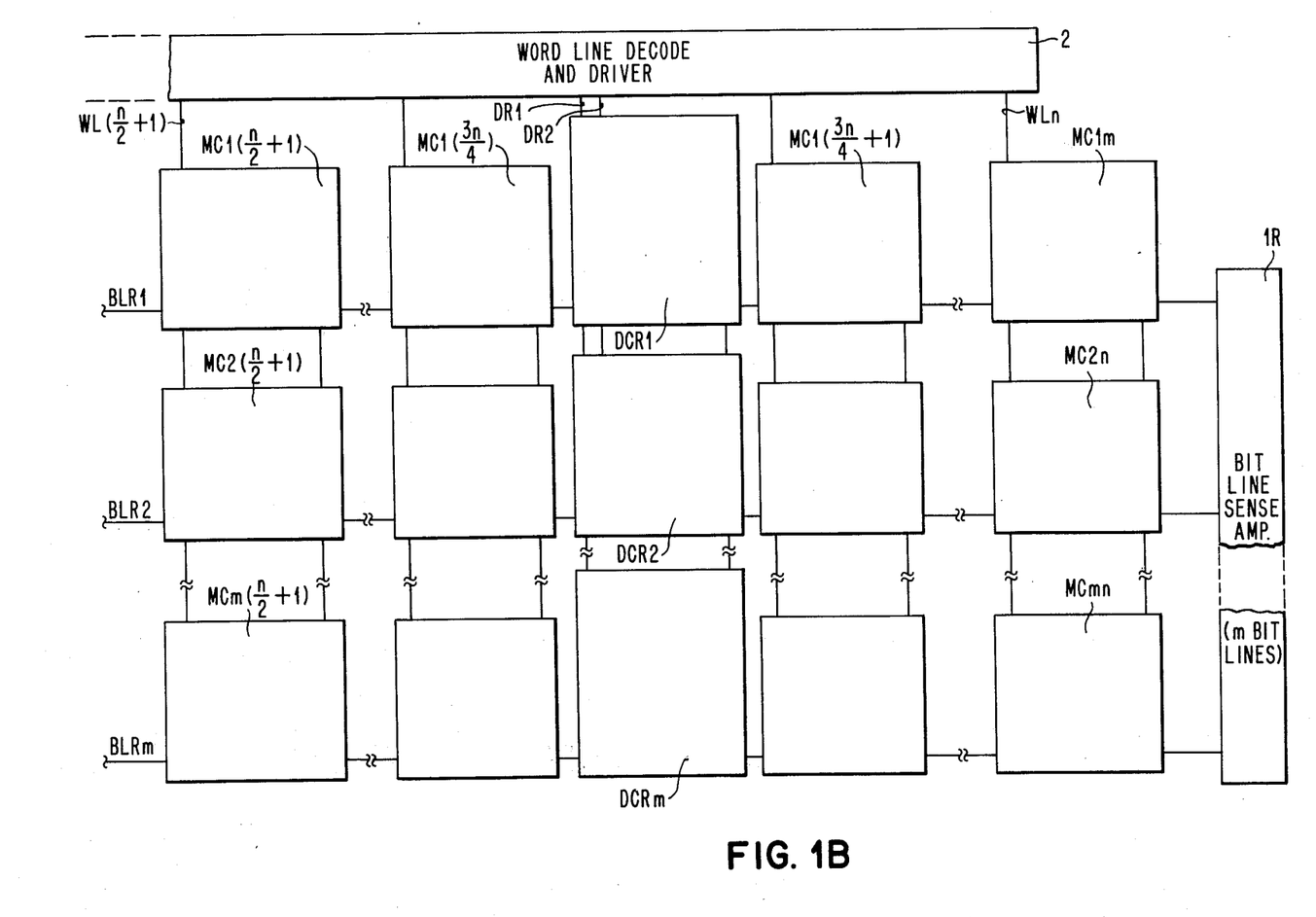

The memory unit schematically depicted in FIG. 1 is an m×n array of memory cells. There are n columns and m rows of memory cells. The memory cells in columns 1 through n are respectively connected to word lines WL1 through WLn. To illustrate: memory cells MC11 through MCm1 are connected to word line WLn/2; and memory cells MC1n through MCmn are connected to word line WLn.

The memory cells in rows 1 through m are respectively connected to bit lines BLL1 and BLR1 through BLLm and BLRm. To illustrate: memory cells MC11 through MC1n/2 are connected to bit line BLL1, memory cells Mc1 (n/2×1) through Mc1n are connected to bit line BLR1; memory cells MCm1 through MCmn/2 are connected to bit line BLLm; and memory cells MCm (n/2×1) through MCmn are connected to bit line BLRm. Thus, it is apparent that each cell in the m×n array is addressable, as will be more fully explained hereinafter, by electrically conditioning the particular word line and bit line connected to the cell selected to be addressed.

Still referring to FIG. 1, a first column of dummy cells DCL1 through DCLm is provided, preferably physically positioned between memory cell columns n/4 and n/4×1. A second column of dummy cells DCR1 through DCRm is also provided, preferably physically positioned between memory cell columns 3n/4 and 3n/4×1. Dummy cells DCR1 through DCLm are respectively connected by leads DL1 and DL2 to Word Line Decode and Driver 2. Also, dummy cells DCL1 through DCLm are each connected to a corresponding one of bit lines BLL1 through BLLm. Dummy cells DCR1 through DCRm are respectively connected by leads DR1 and DR2 to Word Line Decode and Driver 2 and each to a corresponding one of bit lines BLR1 through BLRm. Each of the word lines WL1 through WLn connect a predetermined one of the memory array columns 1 through n to the Word Line Decode and Driver 2. Each of the bit lines BLL1 through BLLm are connected to a predetermined one of the m bit Sense Amplifiers 3 and Bit Line Decode and Driver 1L. Each of the bit lines BLR1 through BLRm are connected to a corresponding predetermined one of the m bit Sense Amplifiers 3 and Bit Decode and Driver 1R.

In FIG. 1, subject to process tolerances, variations etc., each of the memory cells MC11 through MCMn is identical one to another. Also, each of the memory cells is connected in like manner to the word line and bit line associated with said cell. Thus, referring to the lumped parameter schematic of cell MC11 of FIG. 1, each memory cell includes a field effect transistor T1, an integrated capacitor C1 and a parasitic capacitor CS. The integrated capacitor C1, as more fully described hereinafter, is fabricated as an integral of a field effect transistor structure including T1 and CS, where CS is the distributed parasitic capacitance of the source S of T1 with respect to the substrate. The capacitor CS is shown in dashed lines connected between the source S of T1 and the substrate (sub). The dashed lines indicate that no particular structure is added to the monolithic memory to provide the capacitance CS. It is a distributed stray or parasitic capacitance inherent in the monolithic structure. Integrated capacitor C1 is connected between the source S and a referance potential (ground). The capacitor C1 may be considered to comprise a first plate which is the source S of T1 and a second plate, "a polysilicon reference plane". Still referring to cell MC11 of FIG. 1, it is seen that the gate electrode G of T1 is connected to work line WL1 and the drain d of T1 is connected to the bit line BLL1.

Subject to process tolerances, variations, etc., each of the dummy cells DCL1 through DCLm and DCR1 through DCRm is identical one to another. Thus, referring to the lumped parameter schematic of dummy cell DCL1 of FIG. 1, each dummy cell includes a field effect transistor T1, a field effect transistor T2, a capacitor C1 and a capacitor CS. The components T1, C1 and CS correspond to like components of the memory cells, discussed supra, and are interconnected in like manner. However, in the dummy cells, the additional field effect transistor T2 shunts integrated capacitor C1. It is to be noted referring to dummy cell DCL1 that the gate of T2 is connected to line DL2 and the gate of T1 is connected to line DL1. In like manner, dummy cells DCL2 through DCLm are connected to lines DL1 and DL2, and dummy cells DCR1 through DCRm are connected to lines DR1 and DR2.

The Word Line Decoder and Driver 2, Bit Line Decode and Driver 1L, Bit Line Decode and Driver 1R and the m Bit Sense Amplifiers 3, utilizing the n word lines and m bit lines, operate in controlled timed relationship to read, write and regenerate the binary information stored in the n×m array of memory cells. Broadly viewed, the operation of the memory array of FIG. 1 is in general accordance with numerous prior art teachings with which the art is fully conversant. Further, the utilization of "dummy cells" in a monolithic memory array is also a teaching with which the art is conversant. (See for example: U.S. Pat. No. 3,992,704 granted Nov. 16, 1976 to Dieter Kantz on application Ser. No. 610,756, filed Sept. 5, 1975 and U.S. Pat. No. 3,838,295 granted Sept. 24, 1974 to Edward Lindell on application Ser. No. 329,644 filed Feb. 5, 1973). The logical circuitry of the Word Line Decode and Driver 2, the Bit Line Decode and Driver 1L and the Bit Line Decode and Driver 1R may be any one of a number of such circuits known to the art with or without obvious modification. In view of the state of the art, no detailed discussion of the peripheral circuitry is deemed to be in order. Thus, a detailed explanation of the logical circuitry of the Word Line Decode and Driver 2 and Bit Line Decoder and Drivers 1L and 1R is not deemed to be required or in order. The function of the aforerecited peripheral circuitry is well known in the art and will be fully apparent from a detailed explanation of the operation of the memory array of FIG. 1 set forth hereinafter.

Referring to FIG. 1, m bit line sense amplifiers are represented by the block bearing reference character 3. Each of the m bit line sense amplifiers are preferably identical one to another in logical circuitry and structure. As will be fully apparent from the detailed explanation of the operation of the memory array of FIG. 1 set forth hereinafter, the block bearing reference character 3, in addition to representing the m bit line sense amplifiers, represents control and clocking circuitry common thereto. Each of the m bit line sense amplifiers is connected to a discrete pair of bit lines. To illustrate: the one through m bit line sense amplifiers are respectively connected to BLL1 and BLR1, BLL2 and BLR2, - - - BLLm-1 and BLRm-1, and BLLm and BLRm. Numerous bit sense amplifier circuits and structures are known to the art. A number of suitable sense amplifiers, known to persons skilled in the art, may be employed to practice applicants' invention. Merely by way of example, reference is made to the following U.S. Pat. Nos. 3,774,176 granted Nov. 20, 1973 to K. Stein and A. Sibling and entitled "Semiconductor Memory Having Single Transistor Storage Elements and A Flip-Flop Circuit for the Evaluation and Regeneration of Information"; 3,992,704 granted Nov. 16, 1974 to Dieter Kantz, and entitled "Arrangement for Writing-In Binary Signals Into Selected Storage Elements of An MOS-Store"; and 3,838,295 granted Sept. 24, 1974 to Edward Lindell and entitled "Ratioless MOS Sense Amplifier". Hereinafter, with particular reference to FIG. 1C, and in conjunction with a detailed explanation of the operation of the monolithic memory in accordance with the invention, the circuitry of a preferred sense amplifier and its operation is disclosed.

The memory in accordance with the invention is formed of an array of memory cells controlled for reading and writing by word and bit lines connected to the memory cells. Each memory cell comprises a single field effect transistor and an integrated caoacitor. The gate electrode of the transistor is connected to the word line, the drain terminal to the bit line, and the source terminal directly to one of the electrodes of the capacitor. The other electrode of the capacitor is connected to a reference potential. Each word line is connected to a word line decoder. Each bit line is connected to a bit line decoder and a sense amplifier. A dummy cell is connected to each bit line and to logical circuitry within the word line decoder.

In the present invention, a random access memory is provided in an integrated circuit structure in which each cell requires an extremely small area of the semiconductor substrate surface. Thus, a very large memory including many cells can be fabricated on a single substrate and operated at very high speed. In the preferred embodiment of the invention $n=m=128$, whereby the memory has 16,384 memory cells and is termed a 16K memory. In the memory of the present invention, the binary information is stored by storing a charge on a capacitor which is an integrated circuit capacitor. Though this type of storage is not remanent in the same sense as storage in a latch type circuit or a magnetic core, since the charge tends to leak off with time, the time during which the stored charge remains at a satisfactory value has been found to be very long compared with the read-write cycle time for the memory. Thus, even though it is necessary to periodically regenerate the stored information, the regeneration need occupy only 10 to 20% of the time and the memory is used for conventional operations during the remaining 80% of the time. Read/Write cycles of 200–1000 nanoseconds are achievable and, even though regeneration is necessary, the total effect is to provide a memory which has a read-write cycle time, in terms of actual use, in the vicinity of 100–1000 nanoseconds.

Referring to the circuit diagram of FIG. 1C in particular, and with reference to FIG. 1, the operation of the monolithic memory in accordance with the invention will be explained in detail.

Figure 1C:
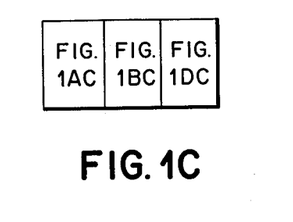
FIG. 1C shows how FIGS. 1AC, 1BC and 1DC are to be placed together to form FIG. 1C.

FIG. 1C shows the storage cell-sense amplifier operation. During the write operation, the bit line decode selects a particular bit line and holds the right hand side at either a "1" or "0" level. The bistable sense amplifier then latches forcing one side up and the other side down. The word line decode then selects one of the word lines that couples the individual storage node to the bit line. After a bootstrap operation to increase the stored up voltage level, the word line voltage drops which isolates the storage node.

During the read operation, as shown in FIG. 1C, the various clock signals in the sense amplifier charge both sides of the sense amplifier to roughly the same voltage (voltage difference depends on the $V_T$'s of two cross coupled FET's which are also used for sensing). The word line decode then selects one cell on the bit line and results in a small charge redistribution depending on the stored potential. For a logic "0", the bit line voltage decreases.

Simultaneously, a dummy cell with only half the storage capacitance on the opposite side of the sense amplifier is addressed. This dummy capacitance is initially discharged prior to every cycle and results in a very small decrease in bit line voltage. The sense amplifier samples this relative potential difference (± depending on stored information) and sets the cross coupled device latch. The sense amplifier sensitivity is such that a logic "1" initially stored can decay to a degree due to leakage and still be correctly read as a logic "1" under nominal conditions. Since a logic "0" is initially stored at very low voltage, the sense amplifier correctly reads with any leakage induced voltage decay.

During a cycle, all cells on a word line are addressed and node voltage restored (refreshed) by the individual sense amplifiers simultaneously. The bit line decode is than activated to read out the stored information on the particular bit line. Since the sense amplifier acts as an inverter and information is always introduced and read at the right side bit line, a logic "1" is actually stored as an up/down level on storage cell locations on the right/left sides. This inversion is transparent to the memory user.

Since leakage currents will eventually discharge the charge stored on the capacitor, the cells have to be periodically refreshed. A refresh cycle has been designed to allow an internal counter to sequence through the bit line addresses to guarantee a maximum cell retention time.

Figure 2:
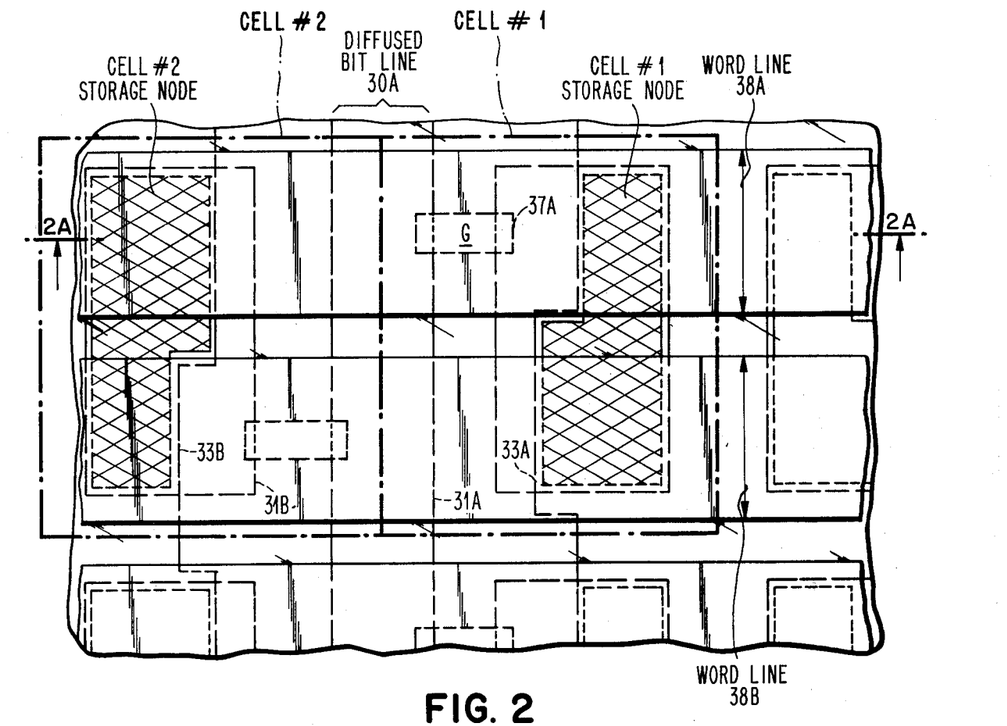
FIG. 2 shows a planar view, partially in section, of a portion of the monolithic memory in accordance with the preferred embodiment of the invention and also disclosing a second memory cell layout or arrangement.
Figure 2A:
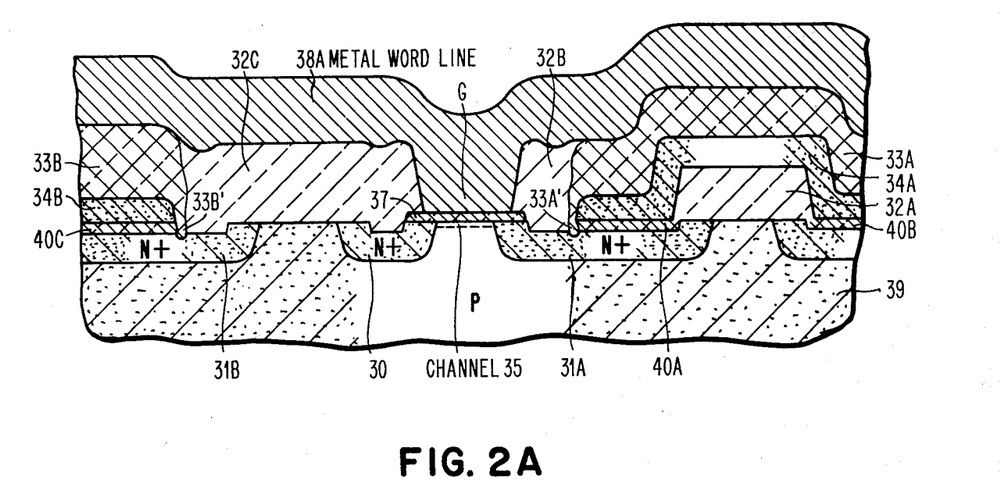
FIG. 2A is a cross-sectional view taken along line 2A—2A of FIG. 2.

Reference is made to FIGS. 2 and 2A wherein a portion of a cell layout of a monolithic memory in accordance with the invention is depicted. FIG. 2 is a planar view including first and second memory cells. FIG. 2A is a cross-sectional view taken along the line 2A—2A of FIG. 2. In FIG. 2, the enclosed broken lines labelled cell #1 and cell #2, respectively, depict the semiconductor area occupied by each memory cell in the memory. The cell area is approximately one square mil. In FIG. 2A, substrate 39 is preferably of P-type silicon having a doping concentration of $7 \times 10^{15}$ atoms of boron per cubic centimeter. The substrate 39 has an N+ region 30. The region 30 preferably has a surface doping concentration of $10^{21}$ atoms of phosphorous per cubic centimeter. As seen from FIG. 2, the N+ region 30 is an elongated region which functions as a diffused bit line 30A and also as one electrode, herein designated the drain, of each FET memory cell associated therewith. The N+ region 31A is the source of the memory cell. The region 31A preferably has a surface doping concentration of $10^{21}$ atoms of phosphorous per cubic centimeter and is formed at the same time as region 30.

The gate dielectric 37 is preferably silicon dioxide having a thickness of approximately 500 Angstroms. The gate electrode G, separated from the channel 35 by layer 37, is preferably formed integrally with the metal word line 38A. The metal is preferably aluminum-copper alloy. The metal gate electrode has a length corresponding approximately to the spacing between the drain and source regions 30 and 31A. The metal gate electrode is separated from the surface of substrate 39 and channel 35 by silicon dioxide layer 37. The area of the gate, width × length, approximately corresponds to the area enclosed by the broken line 37A in FIG. 2. The doped polysilicon reference plane 34A, as seen from FIG. 2A, straddles a relatively thick, preferably 5000 Angstroms, thermally grown silicon dioxide layer 32A which is co-extensive and parallel to the bit line 30A. The reference plane 34A, straddling the layer 32A, also extends parallel to the bit line 30A. The reference plane 34A has a pattern regularity which includes a plurality of generally "l shaped" portions each of which is separated from an N+ region (source) on the substrate by a silicon dioxide layer having a thickness of approximately 500 Angstroms. Each "l shaped" portion of a reference plane functions as a portion of the storage node of a memory cell. In FIG. 2, a "l shaped" portion of reference plane 34A corresponds in configuration to the cross-hatched area labelled "cell #1 storage node", and the "l shaped" portion of reference plane 34B corresponds in configuration to the cross-hatched area labelled "cell #2 storage node".

A polysilicon dioxide layer 33A is superimposed on the doped polysilicon reference plane 34A and a polysilicon dioxide layer 33B is superimposed on the doped polysilicon reference plane 34B. The doped polysilicon reference planes have relatively good electrical conductivity whereas the polysilicon oxide layers serve as electrical insulators. The regions 32B and 32C are thermally grown oxide preferably having a thickness in the order of 7400 Angstroms. The silicon dioxide layers 40A, 40B and 40C, respectively, separate the doped polysilicon reference planes from the N+ source regions. The silicon dioxide layers 40A, 40B and 40C are each approximately 500 Angstroms in thickness. It will be noted, a lip portion 33A' of polysilicon oxide layer 33A encompasses the edges of the reference plane 34A and the oxide layer 40A, and a lip portion 33B' of polysilicon oxide layer 33B encompasses the edges of the reference plane 33B and the oxide layer 40C. As seen more clearly from FIG. 2, the source region 31A underlies and extends beyond the "l shaped" portion of the reference plane. Thus, the storage node of each cell is essentially formed by a "l shaped" portion of doped polysilicon spaced from the source region by a thin oxide layer. Each metal word line, with the exception of gate electrodes, is superimposed upon electrically non-conductive material. For example, metal word line 38A is supported by an insulating layer comprised of polysilicon dioxide and silicon dioxide [as will be apparent from the detailed description of FIGS. 3A through 3M hereinafter; the polysilicon layers 33A and 34A may be replaced by a suitable thick layer of silicon dioxide.] The word lines in FIG. 2 overlie storage node portions of each of the memory cells #1 and #2. The cell layout in accordance with the embodiment of FIG. 2 permits closer spacing of word lines in the memory and thus, contributes to memory density. This is due to the absence of wiring tracks, or channels, since the word lines may be super-imposed on the storace cell sites, yielding a factor of approximately two in density improvement.

Improved Fabrication Process

Referring to FIGS. 3A through 3M, an improved process comprising a sequence of process steps for fabricating a random access memory in accordance with the preferred embodiments of the invention will be described.

Figure 3A:
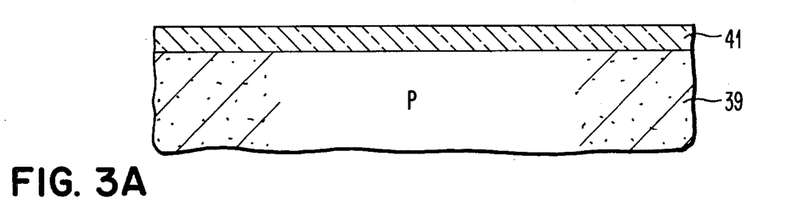
FIG. 3A depicts growth of an initial thermal oxide layer of a P-type semiconductor substrate.

Referring to FIG. 3A: On a 2 ohm-centimeter P-type silicon substrate 39, a silicon dioxide layer 41 having a thickness in the order of 3000 Angstroms is thermally grown by a conventional 1000° C. wet thermal oxide growth process.

Figure 3B:
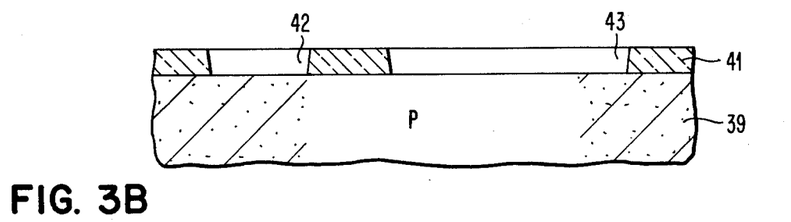
FIG. 3B depicts the opening of first and second spaced apart windows in the oxide layer which will be used to define the N+ regions.

Referring to FIG. 3B: In this figure, the structure of FIG. 3A is depicted subsequent to a first conventional photo mask process step wherein, employing well known photolithographic techniques, spaced apart windows 42 and 43 are etched in silicon dioxide layer 41, which will be employed in forming the drain (common bit line) and the source (storage node) of the memory cell.

Figure 3C:
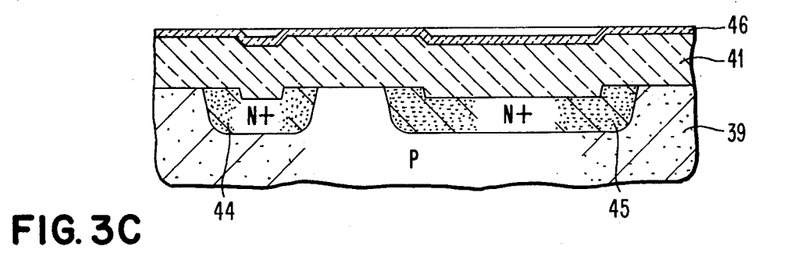
FIG. 3C depicts the N-type doping of first and second regions of the semiconductor substrate surface via the windows, the growth of an oxide layer, and the depositing of P.S.G. (phosphosilicate glass) using a POCl$_3$ treatment in the order of 5% (mde) phosphorus.

Referring to FIG. 3C: The following steps are taken to arrive at the structure depicted in FIG. 3C. N-type doping (phosphorous) is introduced through windows 42 and 43 to provide N+ regions 44 and 45 by a conventional $POCl_3$ N-type doping step, followed by a subsequent oxidation and thermal drive-in step. Thermal oxide is grown to increase the thickness of layer 41 to approximately 5000 Angstroms, of which the top 1000 Angstroms is rich in P.S.G. P.S.G. (phosphosilicate glass) is formed on the surface of the thermally grown oxide layer to provide P.S.G. layer 46. As will be appreciated, during the growth of the thermal oxide, the N-type impurities are further driven in and diffused.

Figure 3D:
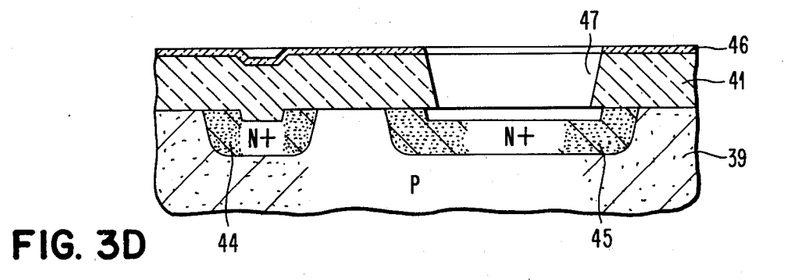
FIG. 3D depicts the opening of a smaller window in the oxide layer superimposed over the second doped region of the semiconductor substrate.

Referring to FIG. 3D: Depicted is the second conventional photo mask stage of the process. Employing well known photolithographic and oxide etching techniques, window 47 is provided. This defines the location of the storage capacitor.

Figure 3E:
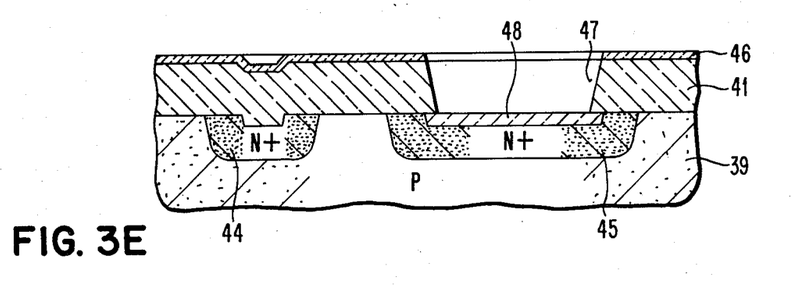
FIG. 3E depicts the growth of a thin oxide layer on said second doped region via said window.

Referring to FIG. 3E: A thin oxide layer 48 is thermally grown in the window 47 on N+ region 45, forming the storage plate capacitor dielectric. The layer 48 is in the order of 500 to 800 Angstroms in thickness. More specifically, the oxide 48 is preferably thermally grown by a conventional dry oxidation process.

Figure 3F:
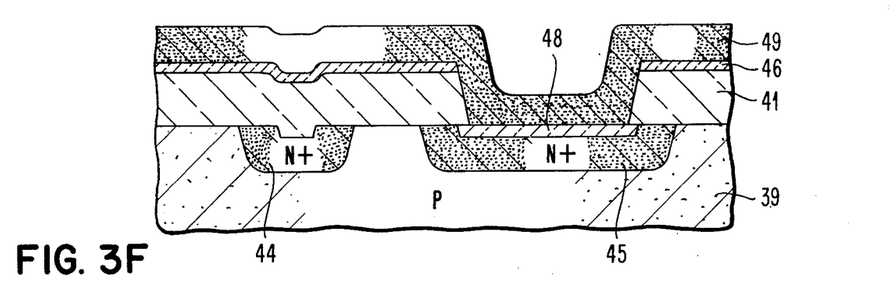
FIG. 3F depicts the depositing of a polysilicon layer on the exposed surface of the structure.

Referring to FIG. 3F: By conventional chemical vapor deposition (C.V.D.) techniques at a temperature of approximately 650° C., a polysilicon layer 49 is laid down on all exposed surfaces of the structure.

Figure 3G:
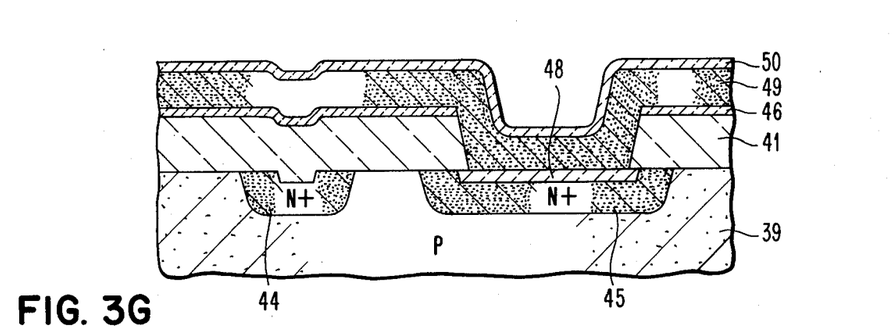
FIG. 3G depicts the N-type doping of the polysilicon layer by a deposited P.S.G. layer and subsequent heat treatment during an oxide layer growth on the polysilicon layer.

Referring to FIG. 3G: The polysilicon layer 49 is doped with N-type impurities. More specifically, $POCl_3$ at 870° C. is employed in the generally known doping process step. The polysilicon is doped N-type with the $POCl_3$ and a subsequent high temperature step drives the dopant in. The polysilicon can also be doped by in-situ or ion implantation processes, with phosphorous to yield an N-type conductivity. During the $POCl_3$ doping embodiment, and under the process conditions thereof, a thin thermal oxide is grown on the polysilicon layer to form a thin layer 50 of phosphosilicate glass (P.S.G.) on the polysilicon layer 49.

Figure 3H:
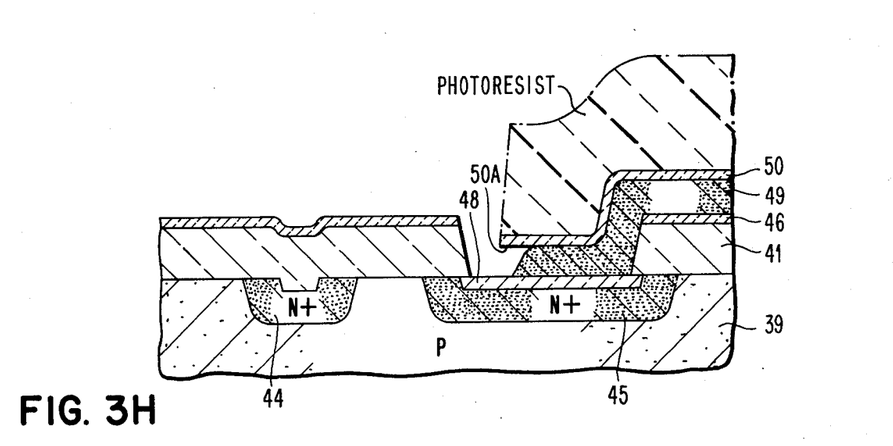
FIG. 3H depicts the removal of a selected portion of the last oxide growth layer, delineated using a photoresist layer, and of a selected portion of the doped polysilicon layer using the etched oxide layer as a mask.

Referring to FIG. 3H: FIG. 3H depicts the structure at the third photo mask stage of the process. The photoresist material P.R. is depicted in phanton in FIG. 3H merely for convenience of explanation of the process steps, explained hereafter. In conjunction with well known photolithographic techniques, initially etch the exposed portion of thin P.S.G. layer 50 by employing buffered HF. Thereafter, the etched image of the oxide layer 50 is used as the mask to etch the polysilicon layer 49. An etching solution of ethylene diamine-pyrocatechol is now used to preferentially etch the polysilicon. It will be noted, as depicted in FIG. 3H, that the etch solution undercuts a portion of the remaining portion of P.S.G. layer 50 and leaves an exposed extended portion 50A of P.S.G.

Figure 3I:
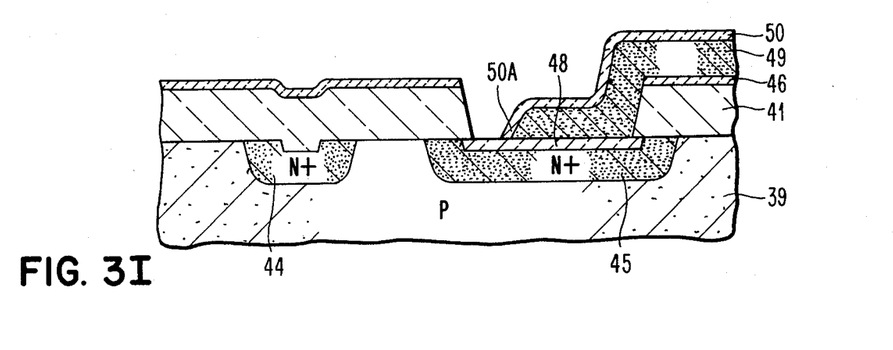
FIG. 3I depicts a small exposed extended portion of the remaining P.S.G. layer plastically deforming to partially cover an exposed portion of the remaining doped polysilicon layer.

Referring to FIG. 3I: Depicted is the exposed extended portion 50A of P.S.G. layer 50 plastically deformed to overlie the exposed portion of doped polysilicon layer 49. The plastic deformation, as will be apparent to persons skilled in the art, actually occurs during the next process step wherein a temperature of approximately 900° C. is employed. FIG. 3I is expressly set forth to clearly illustrate this feature. This step occurs only for the $POCl_3$ doping alternative discussed for FIG. 3G. If in-situ or ion implantation processes were used in FIG. 3G, then this more complex process for forming the folded edge 50A can be avoided. Further simplification can be achieved by using conventional plasma etching techniques.

Figure 3J:
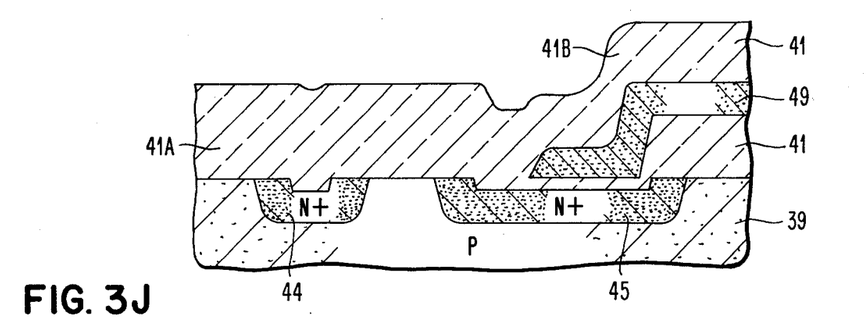
FIG. 3J depicts the growth of a thick oxide layer over the exposed surface of the structure.

Referring to FIG. 3J: Depicted is the structure subsequent to the thermal growing of silicon dioxide on the exposed surface of the structure. The source/drain drive in diffusion and continued oxidation is continued at 900°–1000° C. in steam. Thus, the oxide layer 41 has a thickness in the order of 7300 Angstroms in the portion thereof designated 41A and a thickness in the order of 4000 Angstroms in the portion thereof designated 41B.

Figure 3K:
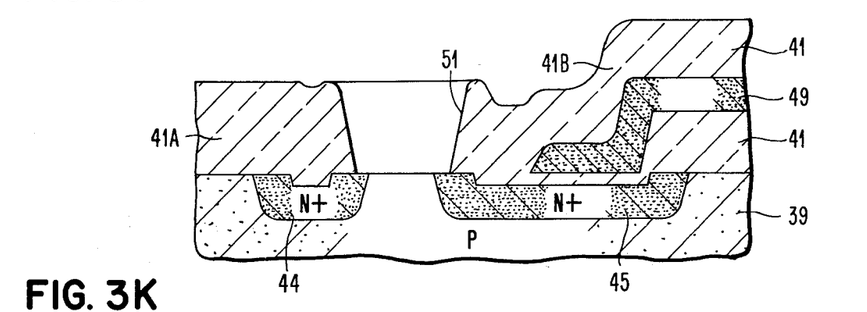
FIG. 3K depicts the opening of a (gate) window in the oxide layer to the substrate surface area between said first and second regions.

Referring to FIG. 3K: This is the fourth photo mask. By known photolithographic and oxide etching techniques, window 51 is provided in oxide layer 41. As is apparent, window 51 is the gate electrode opening in the oxide layer.

Figure 3L:
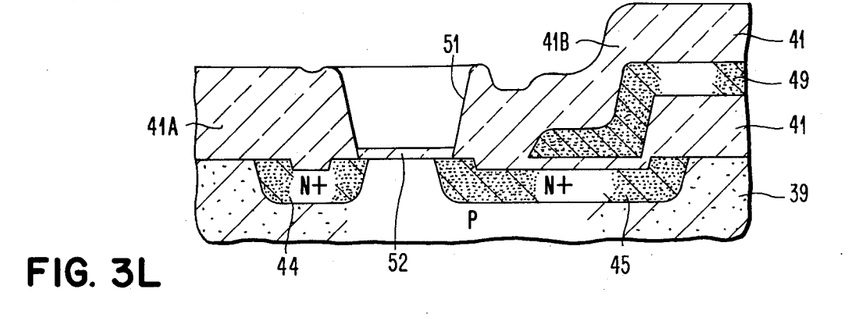
FIG. 3L depicts the depositing of a thin oxide layer (gate dielectric) on the substrate surface exposed by said window.

Referring to FIG. 3L: A thin silicon dioxide layer 52 having a thickness in the order of 500 to 800 Angstroms is thermally grown. The oxide layer 52, as is well known in the art, is termed the gate dielectric in FET terminology. The devices in the peripheral support circuits are opened at the same time.

Figure 3M:
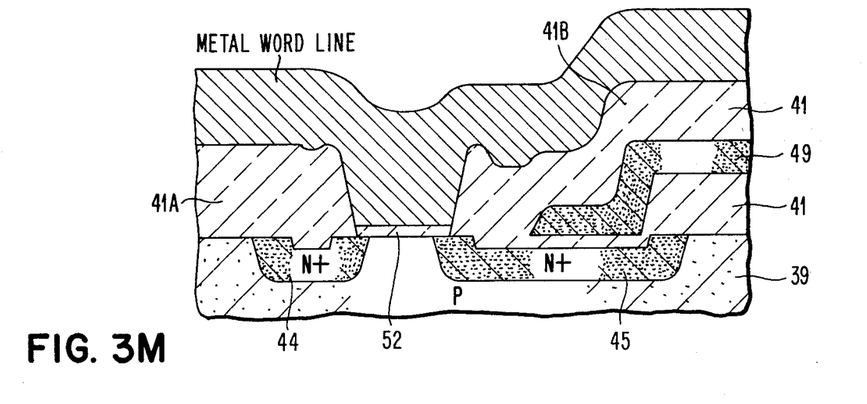
FIG. 3M depicts the providing of a metal word line integral with the gate electrode.

Referring to FIG. 3M: By well known photolithographic and etching techniques, additional contact openings (not shown) are provided where required in the structure of the monolithic memory. For example, a contact opening to doped polysilicon layer 49 which herein earlier has been referred to as a doped polysilicon reference plane is provided. Al-Cu gate and interconnection metallurgy is deposited by evaporation and defined by using a standard photolithographic etching technique. The resulting cross-section is shown in FIG. 3M.

The afore-recited sequences of process steps requires a minimum number of photo mask stages to fabricate an improved monolithic memory in accordance with the invention.

Referring to FIGS. 4A through 4F, the fabrication of field effect transistors for peripheral circuits of the monolithic memory in accordance with the invention will be described. It is to be appreciated that the process steps of fabricating the conventional field effect transistors of the peripheral circuitry are carried out concurrently with the process steps recited hereinabove with reference to FIGS. 3A through 3M. As is apparent to persons skilled in the art, only a single process comprising a plurality of sequential process steps is employed to fabricate the entire monolithic memory in accordance with the invention.

Figure 4A:
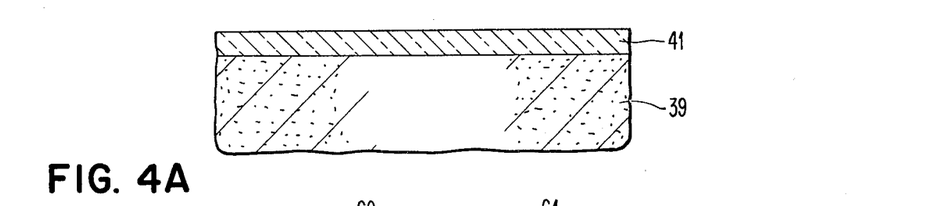
FIG. 4A depicts growth of the initial thermal oxide layer on a P-type semiconductor substrate.

Referring to FIG. 4A: The structure depicted in this figure corresponds to the structure of FIG. 3A. Also, the process step of providing the oxide layer 41 is the same process step explained hereinabove with reference to FIG. 3A.

Figure 4B:
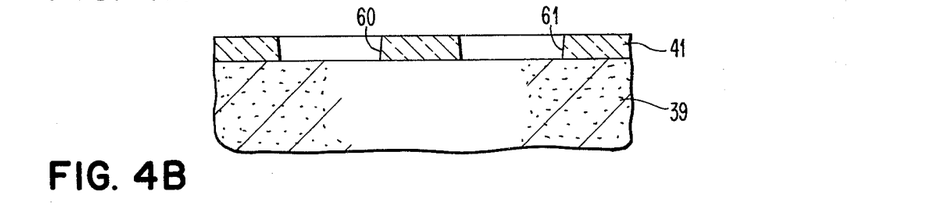
FIG. 4B depicts the opening of first and second spaced apart windows in the oxide layer.

Referring to FIG. 4B: The structure depicted is at the same process stage as the structure depicted in FIG. 3B. Spaced apart windows 60 and 61 are provided in the oxide layer 41. FIG. 4B depicts the structure of the portion of the monolithic memory depicted therein for the first photo mask.

Figure 4C:
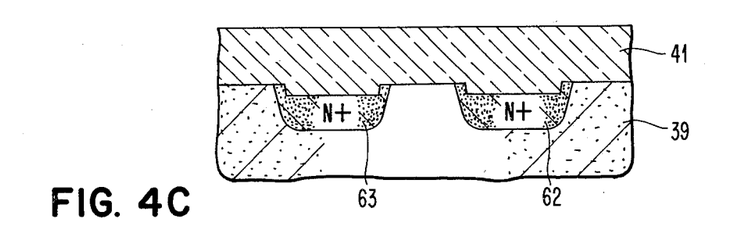
FIG. 4C depicts the doping of first and second regions of the semiconductor substrate surface via the windows and thereafter the growth of an oxide layer over the exposed surface of the structure.

Referring to FIG. 4C: The structure depicted is at the same process stage as the structure depicted in FIG. 3C. Namely, N+ regions 62 and 63 are provided and the oxide layer 41 is increased in thickness to approximately 5000 Angstroms.

Figure 4D:
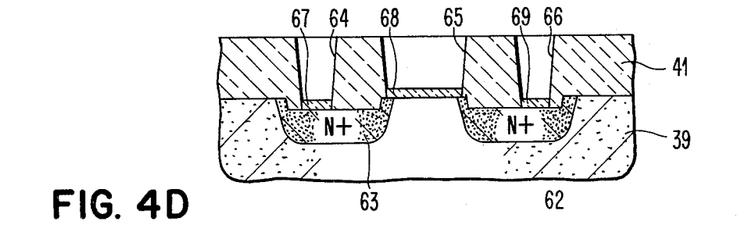
FIG. 4D depicts the opening of first, second and third, spaced aparts windows in said oxide layer and providing a thin oxide layer on the substrate surface exposed by each of said windows. [Said first, second and third windows, respectively, exposing a portion of said first doped region, an area of the substrate surface between said first and second doped regions, and a portion of said second doped region.]

Referring to FIG. 4D: The structure depicted in FIG. 4D is at the same process stage as the structure of FIG. 3L. As depicted in FIG. 4D, the drain, gate and source openings 64, 65 and 66 are provided. Also, thin silicon dioxide layers 67, 68 and 69 are thermally grown. The silicon dioxide layers have a thickness of approximately 500 Angstroms.

Figure 4E:
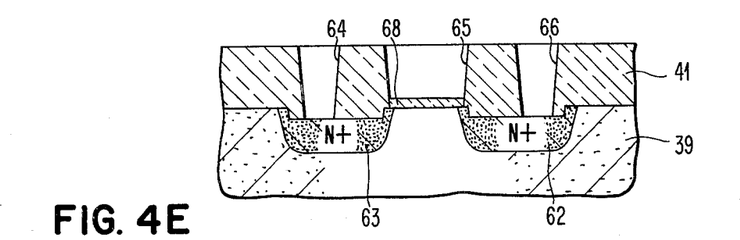
FIG. 4E depicts the removal of the thin oxide layer deposited on the semiconductor surface exposed of said first and third windows, whereby the thin oxide layer (gate dielectric) deposited via said second window remains.

Referring to FIG. 4E: The structure depicted is at a fifth photo mask stage of the process. As seen from FIG. 4E, the thin oxide layers 67 and 69 are removed.

Figure 4F:
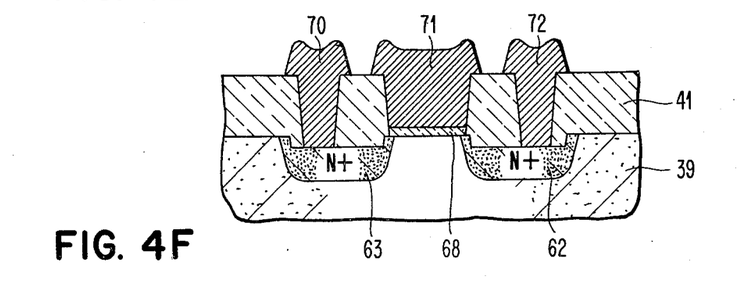
FIG. 4F depicts the providing of a metal contact to the first doped region (drain), a metal gate electrode overlying said gate dielectric and a metal contact to the second doped region (source).

Referring to FIG. 4F: The structure depicted is at the same process stage as the structure depicted in FIG. 3M. A metal gate FET is formed with contacts to its source and drain.

In the illustrative embodiments of the process of fabrication set forth above, certain techniques and steps, which are conventional and well known to those skilled in the art, have not been expressly recited for purposes of brevity. For example, (1) cleansing of the semiconductor and its surfaces, (2) providing a substrate metal contact, (3) ion implantation of N-type impurities rather than gaseous deposition, and (4) other techniques known to the art.

While the invention has been particularly described with reference to the preferred embodiments thereof, it will be understood by those skilled in the art that the foregoing and other changes in form and details may be made therein without departing from the spirit and scope of the invention.

What is claimed is:

1. In a read/write monolithic memory having n×m like memory cells, said memory cells being arranged in n columns and m rows, n word lines respectively connected to the m memory cells of a discrete one of said n columns, m bit lines respectively connected to the n memory cells of a discrete one of said m rows, said memory comprising:
   (a) a substrate of semiconductor material of a first conductivity type having at least one planar surface;
   (b) m diffused bit lines of a second conductivity type respectively lying on and extending into said planar surface of said substrate, said m diffused bit lines extending in a row direction, said m diffused bit lines being uniformly spaced one from another on said planar surface of said substrate;
   (c) m/2 doped polysilicon reference planes, each of said planes extending in a row direction between discrete first and second ones of said m diffused bit lines, each said m/2 doped polysilicon planes being generally inverted u-shaped in cross section and being separated from the surface of said substrate by an oxide layer of non-uniform thickness;
   (d) n×m like memory cells, each said memory cell including a drain, a gate, a source and an integrated capacitor, said memory cells being arranged in n columns and m rows, each of said m diffused bit lines integrally providing the drain electrode of its n associated memory cells, each of said n word lines being connected to the gate of its m associated memory cells, said integrated capacitor of each memory cell having as a first capacitive plate at least a portion of the source of the memory cell, and as a second capacitive plate a portion of one of said m/2 reference planes, said portion of the reference plane overlying and being dielectrically spaced from the first plate by said oxide layer, whereby each of said m/2 doped polysilicon reference planes provides the second plate of the integrated capacitors of the memory cells connected to the two diffused bit lines adjacently spaced thereto.

2. In a read/write monolithic memory having n×m like memory cells, said memory cells being arranged in n groups of memory cells, each group including m memory cells, n word lines respectively connected to the m memory cells of a discrete one of said n groups, m bit lines respectively connected to a discrete one of the memory cells of each of said n groups of memory cells, said memory comprising:
   (a) a substrate of semiconductor material of a first conductivity type having at least one planar surface;
   (b) m diffused bit lines of a second conductivity type respectively lying on and extending into said planar surface of said substrate, said m diffused bit lines extending in a columnar direction, said m diffused bit lines being spaced one from another on said planar surface of said substrate;
   (c) m/2 doped polysilicon reference planes, each of said planes extending in a columnar direction between discrete first and second ones of said m diffused bit lines, each of said m/2 doped polysilicon planes being generaly u-shaped in cross sectional configuration, and being separated from the surface of said substrate by an oxide layer of non-uniform thickness;
   (d) n×m single device memory cells, each said memory cell including a drain, a gate, a source and an integrated capacitor, each of said m diffused bit lines integrally providing the drain electrode for n associated memory cells, each of said n word lines being connected to the gate of m associated memory cells, said integrated capacitor of each memory cell having as a first capacitive plate at least a portion of the source of the memory cell, and as a second capacitive plate a portion of one of said m/2 reference planes, said portion of the reference plane overlying and being dielectrically spaced from the first plate by a relatively thin portion of said oxide layer, whereby each of said m/2 doped polysilicon reference planes provides the second plate of the integrated capacitors of the memory cells connected to the two diffused bit lines adjacently spaced thereto and each said m/2 doped polysilicon reference planes electrically connects in common the second plate of the capacitors formed therein.

3. In a read/write monolithic memory as recited in claim 2, wherein n and m are respectively positive integer even numbers, each having a magnitude of at least 128.

* * * * *